US011494306B2

(12) United States Patent
Simionescu et al.

(10) Patent No.: US 11,494,306 B2
(45) Date of Patent: Nov. 8, 2022

(54) MANAGING DATA DEPENDENCIES IN A TRANSFER PIPELINE OF A HYBRID DIMM

(71) Applicant: Micron Technology, Inc., Boise, ID (US)

(72) Inventors: Horia C. Simionescu, Foster City, CA (US); Chung Kuang Chin, Saratoga, CA (US); Paul Stonelake, San Jose, CA (US); Narasimhulu Dharanikumar Kotte, Milpitas, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 34 days.

(21) Appl. No.: 17/003,336

(22) Filed: Aug. 26, 2020

(65) Prior Publication Data

US 2021/0089449 A1 Mar. 25, 2021

Related U.S. Application Data

(60) Provisional application No. 62/903,202, filed on Sep. 20, 2019.

(51) Int. Cl.
*G06F 12/084* (2016.01)
*G06F 3/06* (2006.01)
(Continued)

(52) U.S. Cl.
CPC .......... *G06F 12/084* (2013.01); *G06F 3/0604* (2013.01); *G06F 3/0659* (2013.01);
(Continued)

(58) Field of Classification Search
None
See application file for complete search history.

(56) References Cited

U.S. PATENT DOCUMENTS 6,470,445 B1 10/2002 Arnold et al.
8,140,764 B2 3/2012 Shen et al.
(Continued)

FOREIGN PATENT DOCUMENTS

WO 2017052595 A1 3/2017

OTHER PUBLICATIONS

PCT Notification of Transmittal Of The International Search Report And The Written Opinion Of The International Searching Authority for PCT Application No. PCT/US2020/051391, dated Dec. 23, 2020, 12 pages.
(Continued)

*Primary Examiner* — Charles J Choi
(74) *Attorney, Agent, or Firm* — Lowenstein Sandler LLP (57) ABSTRACT

Systems and methods are disclosed including a first memory component, a second memory component having a lower access latency than the first memory component and acting as a cache for the first memory component, and a processing device operatively coupled to the first and second memory components. The processing device can perform operations including receiving a data access operation and, responsive to determining that a data structure includes an indication of an outstanding data transfer of data associated with a physical address of the data access operation, determining whether an operation to copy the data, associated with the physical address, from the first memory component to the second memory component is scheduled to be executed. The processing device can further perform operations including determining to delay a scheduling of an execution of the data access operation until the operation to copy the data is executed.

20 Claims, 5 Drawing Sheets

(51) Int. Cl.
*G06F 13/16* (2006.01)
*G11C 14/00* (2006.01)

(52) U.S. Cl.
CPC ........ *G06F 3/0685* (2013.01); *G06F 13/1668* (2013.01); *G06F 2212/604* (2013.01); *G11C 14/0018* (2013.01); *G11C 14/0045* (2013.01)

(56) References Cited

U.S. PATENT DOCUMENTS

| | | | |
|---|---|---|---|
| 9,201,796 | B2 | 12/2015 | Biswas et al. |
| 9,292,294 | B2 | 3/2016 | Al-Otoom et al. |
| 10,019,196 | B2 | 7/2018 | Zaltsman et al. |
| 2003/0135713 | A1 | 7/2003 | Rychlik et al. |
| 2004/0088479 | A1 | 5/2004 | Hall |
| 2004/0205300 | A1 | 10/2004 | Bearden |
| 2006/0026371 | A1 | 2/2006 | Chrysos et al. |
| 2006/0184740 | A1 | 8/2006 | Ishikawa et al. |
| 2008/0189452 | A1 | 8/2008 | Merry et al. |
| 2009/0100224 | A1 | 4/2009 | Wang |
| 2011/0153949 | A1* | 6/2011 | Olszewski ............ G06F 12/128 711/133 |
| 2013/0212319 | A1 | 8/2013 | Hida et al. |
| 2014/0089600 | A1* | 3/2014 | Biswas ............... G06F 12/0859 711/141 |
| 2014/0372668 | A1 | 12/2014 | Yeh |
| 2015/0081981 | A1 | 3/2015 | McKean et al. |
| 2016/0085639 | A1 | 3/2016 | Abouzour et al. |
| 2016/0092356 | A1 | 3/2016 | Suman et al. |
| 2016/0092359 | A1 | 3/2016 | Busaba et al. |
| 2016/0139828 | A1* | 5/2016 | Yan ....................... G06F 3/0659 711/103 |
| 2016/0170887 | A1 | 6/2016 | Jafri et al. |
| 2017/0103553 | A1* | 4/2017 | Busayarat ............... H04L 67/42 |
| 2017/0115891 | A1 | 4/2017 | OKrafka et al. |
| 2017/0371660 | A1 | 12/2017 | Smith et al. |
| 2018/0107595 | A1 | 4/2018 | Jung |
| 2018/0113629 | A1 | 4/2018 | Kim et al. |
| 2018/0365016 | A1 | 12/2018 | Iuliano et al. |
| 2019/0056953 | A1 | 2/2019 | Hsu et al. |
| 2019/0171575 | A1 | 6/2019 | Chen et al. |
| 2020/0142702 | A1 | 5/2020 | Fatehi et al. |

OTHER PUBLICATIONS

PCT Notification of Transmittal Of The International Search Report And The Written Opinion Of The International Searching Authority for PCT Application No. PCT/US2020/051299, dated Dec. 23, 2020, 9 pages.

PCT Notification of Transmittal Of The International Search Report And The Written Opinion Of The International Searching Authority for PCT Application No. PCT/US2020/051634, dated Dec. 23, 2020, 11 pages.

* cited by examiner

MANAGING DATA DEPENDENCIES IN A TRANSFER PIPELINE OF A HYBRID DIMM

RELATED APPLICATION

This application claims the benefit of U.S. Provisional Application No. 62/903,202, filed Sep. 20, 2019, the entire content of which is hereby incorporated by reference.

TECHNICAL FIELD

Embodiments of the disclosure relate generally to memory sub-systems, and more specifically, relate to managing data dependencies in a transfer pipeline of a hybrid dual in-line memory module.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to managing data dependencies in a transfer pipeline of a hybrid dual in-line memory module (DIMM). A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include both non-volatile and volatile memory devices. One example of non-volatile memory devices is a negative-and (NAND) memory device. Another example is a three-dimensional cross-point ("3D cross-point") memory device, which is a cross-point array of non-volatile memory cells. Other examples of non-volatile memory devices are described below in conjunction with FIG. 1. A non-volatile memory device is a package of one or more dice. The dice in the packages can be assigned to one or more channels for communicating with a memory sub-system controller. Each die can include a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values. The non-volatile memory devices can include three-dimensional cross-point ("3D cross-point") memory devices that are a cross-point array of non-volatile memory cells and can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Such non-volatile memory devices can group pages across dice and channels to form management units (MUs).

The memory sub-system can be a hybrid DIMM that includes a first type of a memory device (e.g., 3D cross-point media) and a second type of memory device (e.g., a dynamic random access memory (DRAM)) in a single DIMM package. The first type of memory device (e.g., a first memory type) can have a large storage capacity but a high access latency while the second type of memory device (e.g., a second memory type) has a smaller amount of volatile memory but a lower access latency. A cache manager can manage retrieval, storage, and delivery of data to and from the first type of memory device and the second type of memory device. Data transfers between the first type of a memory device (e.g., 3D cross-point) and the second type of a memory device (e.g., DRAM) require more time to process as compared to the processing speed of a cache manager processing a data access command (e.g., read access command and write access command) from a host system.

The cache manager allows the second type of memory to act as a cache for the first memory type. Thus, the high latency of the first memory type can be masked by the low latency of the second memory type if the cache hit rate is high. For example, a DRAM memory device, or other volatile memory, can be used as a cache memory for a 3D cross-point memory device, or other non-volatile memory device, such as storage class memory (SCM). The host system can utilize the hybrid DIMM to retrieve and store data at the 3D cross-point memory. The hybrid DIMM can be coupled with the host system by a bus interface (e.g., the DIMM connector). The DIMM connector can be a synchronous or an asynchronous interface between the hybrid DIMM and the host system. When the host system provides a data access command, such as a read access command, the corresponding data can be returned to the host system from the 3D cross-point memory or from another memory device of the hybrid DIMM that is a cache memory for the 3D cross-point memory.

The DRAM also can have long latency as compared to a cache manager. For example, a cache lookup can take a few cycles (e.g., 4 cycles) to determine how data should be moved from one device to another. When multiple data transfers are implemented as a data pipeline, the throughput can be even higher (e.g., every clock cycle, if not limited by a component's throughput). Therefore, during the time when a data transfer (e.g., a data access operation such as read operation, write operation, delete operation, etc.) is being performed, there could be dozens of lookup results available, resulting in more data transfers required to be performed.

In conventional memory systems, all data transfers can be lined up (e.g., queued) in the order as determined by the cache lookup results (e.g., first in, first out, hereafter "FIFO") to prevent issues related to data dependencies. Data dependency is a situation in which a data transfer or data access request refers to data being operated on by a preceding data transfer or data access request. For example, a cache manager can receive a write access command for a physical address, followed by a read access command for the same physical address. If the read access command is performed prior to the write access command, the read access command will read incorrect data, as the write access command has not yet been processed. However, lining up the data transfers in order can be undesirable, because not all data transfers have data dependencies and most data transfers can be issued and completed out of order. Completing data access commands out of order can reduce latency experienced by frequent switching between read and write operations, and by switching to a different block or die when outstanding data access commands to said block or die are still queued.

Aspects of the present disclosure address the above and other deficiencies by implementing a set of schemes to manage data dependencies. In some embodiments, the DRAM of a hybrid DIMM can be structured as a data cache that stores recently accessed, and/or highly accessed data from the non-volatile memory, so that such data can be accessed quickly by the host system. In one embodiment, the DRAM data cache can be partitioned into two different data caches that are managed at different data sizes. One of the partitions can include a page cache utilizing a larger granularity (larger size) and the second partition can include a sector cache utilizing a smaller granularity (smaller size). Because the page cache utilizes a larger data size, less metadata is used to manage the data (e.g., only a single valid bit for the entire page). The smaller data size of the sector cache uses larger amounts of metadata (e.g., larger number of valid and dirty bits along with tags, etc.), but can allow for host access data to be more granularly tracked, thus increasing the overall cache hit rate in the DRAM data cache. The hit rate can represent a fraction or percentage of memory access requests pertaining to data which can be found in the DRAM data cache, as opposed to those pertaining to data which is only available in the non-volatile memory. Increasing the hit rate in the DRAM data cache can provide performance comparable to a DIMM with only DRAM memory components, but the presence of the non-volatile memory on the DIMM can additionally provide larger capacity memory, lower cost, and support for persistent memory.

In an illustrative example, to provide a coherent memory in the hybrid DIMM, memory access operations and transfers from one memory component to the other that are dependent on one another can be managed by a cache controller of the hybrid DIMM. In particular, long latency transfers can cause dependency chains and thus the dependent operations can be tracked and executed after the operation (e.g., a transfer) from which it depends. A set of schemes can be used to manage these data dependencies as well as provide improved DIMM performance. A set of content-addressable memory (CAM) data structures can be used to track all outstanding data transfers between the cross-point array memory and the DRAM. The set of CAMS can include at least a sector CAM and a page CAM. Prior to executing a sector transfer (i.e., a transfer between the sector cache of the DRAM and the cross-point array memory), the controller can perform a lookup in the page CAM and the sector CAM to determine if any outstanding transfers are to be performed on the same physical host address. If there is a hit, then the transfer will not begin until the outstanding transfer at the same physical address is completed. If there is no hit for an outstanding transfer to or from the same physical address, then the transfer can be performed immediately because it does not depend on another transfer.

Advantages of the present disclosure include, but are not limited to, an improved performance of the host system that is utilizing the hybrid DIMM. For example, the caching operations between the first memory component and the second memory component can be internal to the hybrid DIMM. Thus, when data is transmitted from the cross-point array memory component to be stored at the DRAM data cache, the transmitting of the data will not utilize an external bus or interface that is also used by the host system when receiving and transmitting write operations and read operations. In addition, the present disclosure can provide for coherent memory in the hybrid DIMM in spite of long latency data transfers between the memory components of the hybrid DIMM.

Figure 1:
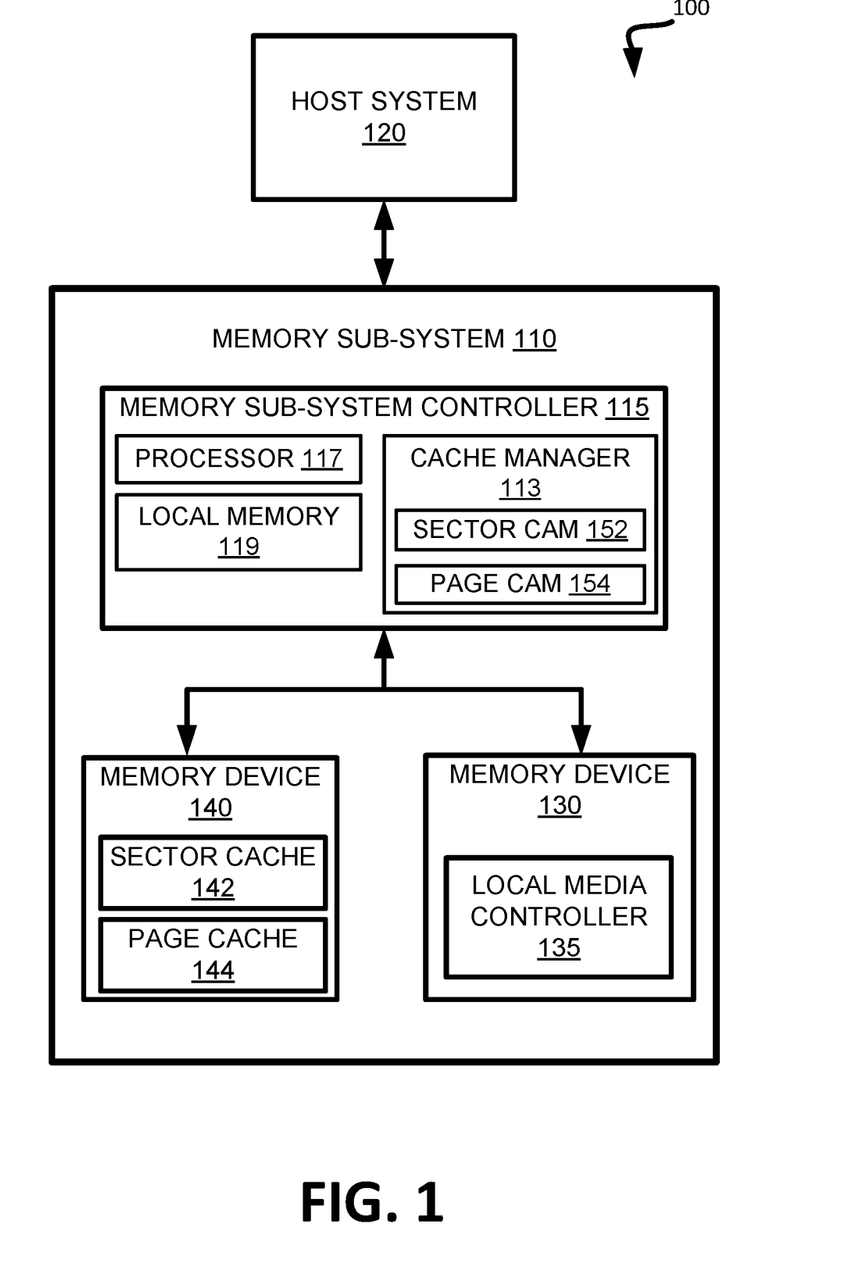
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In one embodiment, the memory sub-system 110 includes a cache manager 113 that can be used to track and manage data in the memory device 130 and the memory device 140. In some embodiments, the memory sub-system controller 115 includes at least a portion of the cache manager 113. In some embodiments, the cache manager 113 is part of the host system 120, an application, or an operating system. In other embodiments, local media controller 135 includes at least a portion of cache manager 113 and is configured to perform the functionality described herein. The cache manager 113 can communicate directly with the memory devices 130 and 140 via a synchronous interface. Furthermore, transfers of data between the memory device 130 and the memory device 140 can be done within the memory sub-system 110 without accessing the host system 120.

The memory device 140 can include a data cache that stores data from memory device 130 so that future requests for data can be served faster. A cache line is a basic unit for cache storage and can contain multiple bytes and/or words of data. A smaller cache line size has a higher hit rate but requires more tag memory than a large cache size line. A tag is a unique identifier for a group of data that can be used to differentiate different regions of mapped memory.

In some embodiments, all the data that is stored by the memory sub-system 110 can be stored at the memory device 130. Certain data that is stored at the memory device 130 can also be stored at the data cache of the memory device 140. For example, data that is determined to be more frequently, or more recently, accessed by the host system 120 can be stored at the data cache for faster host access. When the host system 120 provides a read request for data stored at the data cache (i.e., a cache hit), the data can be retrieved from the data cache as opposed to being retrieved from the memory device 130. The bandwidth or capability of retrieving data at the data cache can be faster than the bandwidth or capability of retrieving data at the memory device 130.

The data cache of the memory device 140 can be partitioned and include a sector cache 142 to store small cache lines (hereafter "sector(s)") and a page cache 144 to store large cache lines (hereafter "page(s)"). The sector cache 142 and the page cache 144 can be managed at different data sizes. The sector cache 142 can utilize a smaller granularity (smaller size) and the page cache 144 can utilize a larger granularity (larger size). In an example, a page can be 2 kilobytes in size, and a sector can be 64 bytes in size. A page can include one or more sectors. The page cache 144 can require less metadata to manage data (e.g., only a single valid bit for the entire page) utilizes a larger data size. The smaller data size of the sector cache 142 can require larger amounts of metadata (e.g., larger number of valid bits and/or dirty bits, tags etc.). Pages in the page cache 144 can be organized into one or more sets. In an example, a page set includes 24 pages. Similarly, sectors in sector cache 142 can be organized into one or more sets. In an example, a sector set includes 16 sectors.

The memory device 130 can store and manage data at a small granularity similar to the sector cache. For example, data can be stored at the memory device 130 at a data payload size, which can include one or more sectors in the sector cache 142. Data can therefore be transferred between the memory device 130 and the sector cache 142 at the data payload size (e.g., one or more sectors at a time).

The cache manager 113 can manage a set of content-addressable memory (CAM) data structures which track all outstanding data transfers between the memory device 130 and the memory device 140. The cache manager 113 can include a CAM 152 and a page CAM 154. The cache manager 113 can use the sector CAM 152 and the page CAM 154 to track all outstanding data transfers (e.g., read commands, write commands, additional transfers, etc.). For example, prior to the cache manager 113 performing a data transfer, the cache manager 113 can look up the sector CAM 152 to check if there is any outstanding data transfers to and/or from a same physical address. If the lookup generates a hit, the cache manager 113 does not execute the data transfer until the hit data transfer is completed. If the lookup is a miss, the cache manager 113 can execute the data transfer.

Each data transfer can be associated with an identifier. For example, each host read command can include an associated read identifier (RID), each host write command can include an associated write identifier (WID), and each additional transfer required to maintain the cache (e.g., sector cache 142, page cache 144, etc.) can have a transfer identifier (XID). The cache manager 113 can include a set of transfer types are tracked for data dependency. Examples of the transfer types can include a read buffer transfer (memory device 140 to read buffer), a write buffer transfer (write buffer to memory device 140), page evict transfer (memory device 140 to a memory device 130 page), sector evict transfer (memory device 140 to a memory device 140 sector), page fill transfer (memory device 130 to memory device 140), and read miss transfer (memory device 130 to memory device 140 and the read buffer). Each of the listed transfer types, except for page evict transfer, are sector transfers and sector transfers can be tracked by the sector CAM 152. The page evict transfer which is a page transfer can be tracked by the page CAM 154. At the initiation of a transfer, addresses indicated by the RID, WID, or XID can be stored in its corresponding CAM (e.g., sector CAM 152 and/or page CAM 154) until the transfer is completed. Thus, any outstanding transfers are included in the CAM via their associated ID. In addition, if more than one sector of a page is included in the sector CAM 152 at one time (i.e., outstanding) then the page can be added to the page CAM 154 as well.

When a new transfer is begun, the cache manager 113 can search both the sector CAM 152 and the page CAM 154 to determine whether a transfer corresponding to a same sector address or page address already exists in the sector CAM 152 or the page CAM 154. If the new transfer is a sector transfer and there is a hit in the sector CAM 152, then the new transfer can be placed in the sector CAM 152 to be executed after the earlier transfer is complete. In this manner, multiple sector transfers can be chained together in the sector CAM 152 to be executed in order. If there is a hit in the page CAM 154 then the new transfer of the sector is placed in the sector CAM 152 but is executed only after the earlier page transfer is complete. Similarly, if the page address of a set of sectors is included in the page CAM 154, then the new transfer can wait until the transfer of the set of sectors is complete before being executed.

The sector CAM 152 can have a finite size, which can depend on a maximum number of outstanding data transfers supported. By way of example, the maximum number of read access commands supported by the sector CAM 152 can be 256 and the maximum number of write access commands supported by the sector CAM 152 can be 64. If all transfers can be directly tied to the read or write access commands, the maximum number of outstanding transfers can be as higher (e.g., 320). However, any number of read access commands and write access commands can be supported by the sector CAM 152. Some data transfers can be separately identified and may not be directly tied to a read access command or write access command due to moving data from the sector cache 142 to page cache 144, and due to evicting multiple dirty sectors (e.g., sector(s) with a dirty bit) of a sector group. A dirty bit can be used to indicate whether the sector has data inconsistent with non-volatile memory (e.g., memory device 130). For additional data transfers, another set of data transfer IDs (XIDs) can be used. In an example, 192 XIDs can be used. Thus, using the above example, the addition set of data transfers IDs can bring the total number of data transfer IDs to 512. The depth of the sector CAM 152 can, therefore, be 512.

To track unfinished sector transfers, the cache manager 113 can use the sector CAM 152 to record an outstanding sector transfer's address. When a sector transfer is issued, the cache manager 113 can perform a sector CAM 152 looked up. In response to the sector CAM 152 lookup being a miss, a sector address of the issued sector transfer can be recorded in the sector CAM 152 at the location indexed by the sector transfer's ID (e.g., RID, WID, and XID). In response to the sector CAM 152 lookup being a hit, the sector address of the issued sector transfer can be recorded in the sector CAM 152 at the location indexed by the sector transfer's ID, and the hit entry can be invalidated. When a sector transfer is finished, cache manager 113 can remove the sector transfer from the sector CAM 152 by invalidating its corresponding entry. The sector CAM 152 can be used twice for every sector transfer (e.g., once for a lookup, and once for a write). Each sector transfer can also be invalidated if a valid bit is part of the sector CAM entry. A valid bit can be used to indicate whether a sector is valid (e.g., whether the cache line associated with the sector is allocated for a transfer (not valid) or received the transfer (valid)). The sector CAM 152 can utilize external valid bits, and the cache manager 113 can perform sector CAM invalidation in parallel with sector CAM lookup and write. In some implementations, to improve the sector CAM 152 lookup performance, two or more sector CAMs can be used. For example, a first sector CAM can be used for sector transfers with even sector addresses, and a second sector CAM can be used for sector transfers with odd sector addresses.

In addition to sector transfers, the cache manager 113 can execute page transfers to move a page from memory device 140 (e.g., DRAM) to the memory device 130 (e.g., storage memory). To track unfinished page transfers, cache manager 113 can use the page CAM 154 to record an outstanding page transfer's address.

Responsive to the cache manager 113 receiving a data access command, the cache manager 113 can perform a cache lookup in sector cache 142 and/or page cache 144. If the cache lookup results in a hit (e.g., a cache lookup hit), there can be two types of transfers depending on whether the data access command is a read access command or a write access command. For read access commands, the cache manager 113 performs a read buffer transfer, where data is moved from a memory device 140 cache (e.g., sector cache 142, page cache 144, etc.) to a read buffer, which can then be read by the host system 120. For write access commands, the cache manager 113 performs a write buffer transfer, where data is moved to the memory device 140 cache (e.g., sector cache 142 or page cache 144) from a write buffer, which has already been written by the host system 120 with write data.

The cache manager 113 can use a heuristics algorithm to determine that a sector group should be moved to page cache 144. In such a case, additional transfers can occur, which are defined as "page fill." For page fill, the cache manager 113 can select a page based on a sector row and/or page row relationship. The cache manager 113 can then evict the selected page. Missing sectors of the original sector group are read from memory device 130 to fill the newly formed page. The cache manger 113 can then perform additional transfers. In one example, the cache manager 113 can perform a page evict transfer or a flush transfer, where the entire page cache line can be moved to memory device 130 if the page cache line is dirty (e.g., has a dirty bit). In another example, cache manager 113 can perform a page fill transfer, where the missing sectors are read from memory device 130 to the page cache line.

When there is a cache lookup miss, the cache manager 113 can evict a sector-based cache line for incoming data access commands. In an example, the eviction can be based on LRU data. The LRU data can include an LRU value, which can be used to indicate whether a sector cache line is least recently accessed by the host system 120. For example, when a sector is accessed, an LRU value for that sector can be set to a predetermined value (e.g., 24). LRU values for every other sector in the sector cache 142 can be decreased by an amount (e.g., by 1). All the dirty sectors of the evicted sector cache line can be moved to memory device 130 if the eviction mode is sector based, or to page cache 144 if the eviction mode is page based. The page eviction mode includes selecting a page cache line to evict to make room for the evicted sectors and reading sectors that are currently missing in the evicted sector group from the memory device 130. Moving data from the sector cache 142 to the page cache 144 can be performed by exchanging a physical address of the new sector with the physical address of the evicted sector, so there is no actual data transfer happening.

Sector eviction mode can include the following data transfers; sector evict transfer, write buffer transfer, and read miss transfer. For the sector evict transfer, the cache manager 113 can move the dirty sectors to memory device 130. For the write buffer transfer (in response to a write miss), the data transfer does not start until the completion of the evict transfer of the same sector. For a read miss transfer, the missed sector is read from memory device 130 and transmitted to the memory device 140 and to the read buffer. This data transfer does not start until the completion of the evict transfer of the same sector. Page eviction mode can include the following transfers; a page fill transfer, a page evict transfer or a flush transfer, a write buffer transfer, and a read miss transfer. For the write buffer transfer and the read miss transfer, the data transfer does not start until the completion of the page evict transfer.

The cache manager 113 can use a set of schemes to manage data dependencies and to produce high performance. The data dependencies can include a read/write transfer dependency, a sector eviction transfer dependency, a page eviction transfer dependency, and a page fill transfer dependency.

During read and write transfer dependencies, a read transfer can occur to read data from a sector that is being written by an outstanding write transfer command. This can be indicated by a sector CAM lookup hit for the read transfer. The write transfer and the read transfer can go to different data paths, which result in the write transfer being completed after the read transfer, even though the write transfer occurred before the read transfer. The cache manager 113 can hold the read transfer until the outstanding write transfer is finished by placing the read transfer into a sector block transfer data structure at the location indexed by the sector CAM lookup hit ID. The cache manager 113 can use the same or a similar mechanism for a write transfer to a sector that is being read by an outstanding read transfer.

When a sector transfer is completed, its corresponding sector block transfer entry can be checked in the sector block transfer data structure. If the ID stored in sector block transfer data structure is not the same ID as the current transfer, the cache manager 113 can unblock the stored transfer. When a sector block transfer has a valid transfer, it can be indicated by a flag, which can be checked to see if another transfer should be unblocked.

Regarding sector eviction transfer dependencies, a sector group can consist of 32 sectors belonging to the same page and sharing the same tag in the sector-based tag memory. When the cache manager 113 evicts a sector, the cache manager 113 can evict an entire sector group because the tag can be replaced. The cache manager 113 can send all dirty sectors to the memory device 130, and each sector can be moved as a distinct and separate sector evict transfer. Before a sector group is to be evicted, there can be at least one write transfer to cause at least one sector to be dirty. When a sector group eviction request occurs before none of the multiple write accesses have been completed, it may not be executed by the cache manager 113 and can hold, which also means that all individual sector evict transfers can hold. To hold the multiple sector evict transfers, a page block transfer data structure can be used.

In some embodiments, multiple outstanding sector transfers share the same page address. The cache manager 113 can create a page in the page CAM 154 to represent the multiple outstanding sector transfers. The page can be called virtual page or "Vpage" (it does not represent an actual page transfer). The cache manager 113 can use a sector count data structure to keep track of a total number of outstanding sector transfers represented by the Vpage. When the first sector transfer of a Vpage is issued, a page CAM lookup can be a miss, so the page address of the sector transfer can be written into the page CAM 154 at a location indexed by the sector's transfer ID, and the sector count indexed by the same ID can be initialized to 1. When a second sector transfer of the Vpage is issued, a page CAM lookup can be a hit, and the sector count indexed by the hit ID can be incremented by 1. When an outstanding sector transfer belonging to a Vpage is completed, the corresponding sector count can be decremented. The cache manager 113 can know sector count to decrement because each sector transfer can record its Vpage in a Vpage data structure. The Vpage together and the sector count can protect the multiple sector transfers so that before they are all completed, the associated page won't be evicted.

When the first sector evict transfer is issued, the cache manger 113 can perform a page CAM 154 lookup. If the page CAM 154 lookup is a miss, the cache manager 113 can create a Vpage and initialize a sector count to include a total number of sector evict transfers. In an example, the sector evict transfers can use the first sector evict transfer ID as their Vpage ID. Subsequent sector evict transfers do not need to do Vpage lookups. If the lookup is a hit, the cache manager 113 can perform similar steps to those performed when the lookup is a miss, with the addition of the hit Vpage being invalidated by the cache manager 113 and all sector evict transfers can be blocked. The cache manager 113 can perform the blocking by placing the first sector evict transfer ID in a page blocked next transfer data structure at a location indexed by the hit ID. The cache manger 113 can also place the first sector evict transfer ID in another data structure (e.g., a page blocked list tail data structure) at the location indexed by the newly created Vpage. For a second sector evict transfer, the cache manager 113 can use the first sector evict transfer ID as its Vpage ID and can also use the page blocked list tail data structure to find the location of a page blocked list to put its own transfer ID, forming a linked list with the first sector evict transfer. The page blocked list tail can also be updated with the second sector evict transfer ID. The cache manager 113 can process the subsequent sector evict transfers like the second transfer so that all sector evict transfers form a linked list and can be unblocked one by one once the first sector evict transfer is unblocked, which can happen when the sector count of its blocking Vpage is down counted to zero.

The cache manager 113 can block a non-evict sector transfer until all sector evict transfers are finished when a sector group is being evicted and another non-evict sector transfer arrives hitting the same sector group. The cache manager 113 can create a new Vpage, invalidate the hit entry, and place the incoming transfer ID in the page blocked next transfer data structure at a location indexed by the hit ID. The cache manager 113 can set a Vpage flush flag associated with a Vpage to indicate a Vpage is representing eviction. Once the new Vpage is created, the second non-evict sector address can still be blocked and can form a blocked linked list with the first non-evict sector transfer hitting the flush Vpage (i.e., Vpage flush=1) unless it is hitting the same sector as the first non-evict sector transfer. To perform this, the newly created Vpage can be indicated as being blocked by using a data structure (e.g., a blocked by page flag data structure). If the second non-evict sector hits the first non-evict sector transfer as determined by a sector CAM lookup (i.e., a hit), the second non-evict sector can be placed in a sector blocked next transfer data structure at a location indexed by the hit ID. If the sector CAM lookup of the second non-evict sector is a hit but the Vpage of the hit transfer is not the first non-evict sector transfer's ID, the second non-evict sector can still be blocked rather than put in the sector blocked next transfer data structure at the location indexed by the hit ID.

Regarding page eviction transfer, to find the page evict address for the page evict transfer, the cache manager 113 can perform a second page CAM lookup can be performed based on the sector evict address found by the sector cache lookup of the first lookup. The second page CAM lookup can be avoided if the page CAM is divided into two sections that can be looked up at the same time. The invalid sectors of the evicted sector group can be filled from storage memory at the same time when the evicted page is being written into the storage memory (e.g., memory device 130). They are independent but the incoming sector transfer for the page CAM lookup miss can be dependent on the page evict transfer or flush transfer.

The cache manager 113 can initiate the flush transfer with a page CAM lookup. If the lookup is a hit, cache manager 113 can insert an entry into the page CAM 154 at a location indexed by a page evict transfer ID, and the hit entry can be invalidated. The page evict transfer ID can also be put in page blocked next transfer data structure at the location indexed by the hit entry. The sector count indexed by the page evict transfer can be set to 1. The corresponding Vpage flush will also be set to indicate the inserted entry is an entry for page eviction so that any transfer hitting this entry can be blocked. If the lookup is a miss, the operation can be like when it is a miss except that there can be no hit entry to invalidate. The entry in the page CAM 113 for flush transfer can represent an actual page transfer rather than a virtual page. The first sector transfer hitting the page for flush can be put in page blocked next transfer data structure if the corresponding sector CAM lookup is a miss. The transfer can also be put in the page blocked list tail data structure at the location indexed by the hit ID so that the second sector transfer hitting the flush page can be linked together if the corresponding sector CAM lookup is a miss. The sector count indexed by the hit ID can also be incremented. If the corresponding sector CAM lookup is a hit, the incoming transfer can be linked to the hit transfer by putting the incoming transfer ID in sector blocked next transfer data structure at the location indexed by the hit transfer.

Regarding page fill dependency transfers, the cache manager 113 can process a page fill like page eviction with minor differences. In an example, page eviction can be triggered by cache lookup miss while page fill is triggered by cache lookup hit. In another example, page fill can select a page by using sector row together with the least significant bit of the sector-based tag instead of performing another page cache lookup (LRUs (least recently used) can still be checked). In yet another example, the sector transfer can be made before the page evict transfer. In yet another example, only the first of the multiple page fill transfers performs a page CAM lookup and the sector count can be updated with the total number of transfers. The subsequent sector transfers do not need page CAM lookup like sector evict transfers. If the page CAM lookup is a miss, cache manager 113 can created a Vpage. If the page CAM lookup hits a flush Vpage, a Vpage can be created also but can be blocked by the flush Vpage. If the page CAM lookup hits a non-flush Vpage, no Vpage will be created but the associated sector transfers can be either made, chained or blocked depending on whether the hit Vpage is blocked and on whether there is a sector CAM lookup hit. Clean operation can be similar to sector evict and page evict transfers.

For a host command from the cache manager 113, the sector CAM 152 can be looked up in the first cycle, written in the second cycle, and invalidated (the hit entry) in the fourth cycle. Since CAM valid bits can be external to the CAM itself, the sector CAM 152 can be used twice for every host command. Since the peak rate of sector CAM lookup can be 2 clock cycles, host commands can also be accepted every 2 clock cycles. Page fill and sector evict operations can issue commands every cycle, but the commands can be for both even and odd sector addresses. Although when the second command arrives, the first command may already be finished with a sector CAM update, a sector CAM pipeline can still have pipeline hazards because the hit entry has not been invalidated, yet.

For a host command from cache manager 113, page CAM 154 can be looked up in the first cycle, written and invalidated (the hit entry if required) in the fourth cycle. When the second command with the same page address as the first command arrives in the third cycle, the page CAM 154 has not been written or updated by the first command, yet, so it can be seeing potentially outdated CAM content and its lookup should not be used.

In an embodiment, cache manager 113 can use a pipeline feedforward mechanism. In an example, the first command can get the lookup result on whether to update page CAM 154 in the fourth cycle. The action to take can also happen in the fourth cycle. The second command can use the first command's lookup result and can have correct action taken knowing that it is a command following the first command. The subsequent commands having the same page address as the first command but different address from the second command may not need feedforward because the page CAM content has already been updated by the time the commands arrive. However, if the third command has the same address as the second command, feedforward can still be required. To detect when feedforward is required, the first command's address can be delayed by 2 clock cycles to compare with the second command. If it is a match, then feedforward can be used.

In some embodiments, the memory devices 130, 140 can be organized as error correction code (ECC) protected codewords (CW) that consist of multiple sectors (e.g., two sectors in a 160-byte CW. Multiple codewords (e.g., CWs of a page) can be protected by parity in a redundant array of independent disks (RAID) manner. To write a sector, the sector's corresponding code word and the parity can be read by the controller 115. The controller 115 can decode old CWs to extract the old sectors. A new sector and another old sector (one not to be overwritten) combined can be encoded into a new CW, which together with the old CW and the old parity can be used to generate a new parity. To write both sectors of a CW, the operation performed by the controller 115 can be similar to writing a single sector. This is because the old CW can be read to generate the new parity, and the old sectors do not need to be extracted. It can therefore advantageous to group all the writes to the same page together because the parity only needs to be read and written once instead of multiple times, one for each sector write. There can be two types of transfers involving writing to the storage memory (sector evict transfer and page evict transfer), both involving writing sectors belonging to the same page. The controller 115 can be informed that the individual sectors of both evict transfers belong to the same page and therefore can be coalesced. In an example, a signal can be used to indicate that a sector write transfer is the last sector write belonging to the same page and should trigger the actual storage memory write for all the sectors preceding the last sector. The write coalescing can better improve performance when the controller 115 has sufficient buffering to accept pending sector writes until the last sector while working on the actual writes of previously received sector writes.

Figure 2:
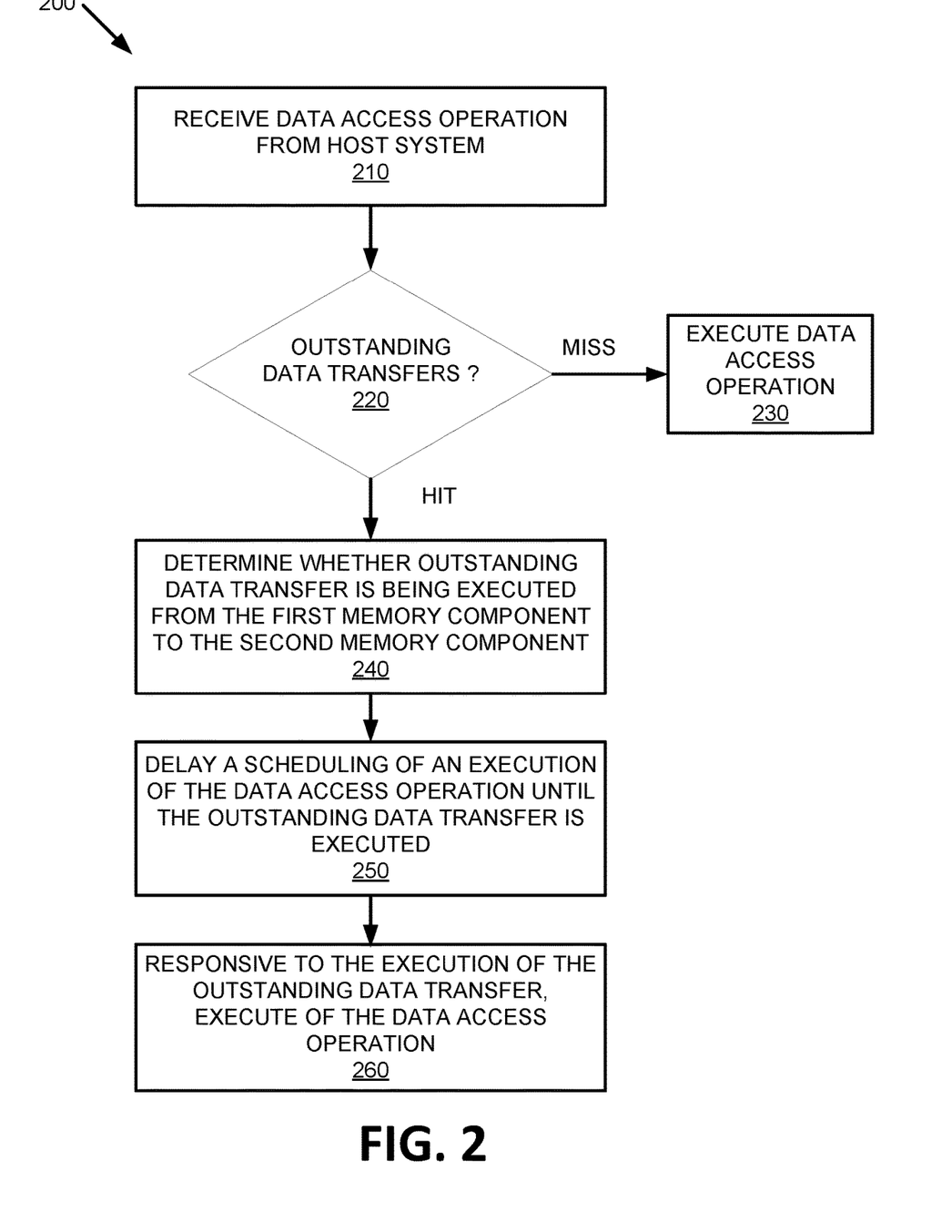
FIG. 2 is a flow diagram of an example method for managing data dependencies in a transfer pipeline, in accordance with some embodiments of the present disclosure.

FIG. 2. is a flow diagram of an example method 200 of managing data dependencies in a transfer pipeline, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the cache manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic receives a data access operation from the host system 120. For example, the memory sub-system controller 115 can receive the data access operation. The memory sub-system controller 115 can be operatively coupled to a first memory device and a second memory device. The first memory device can be the memory device 130 (e.g., cross-point array) and the second memory device can be memory device 140 (e.g., DRAM). The second memory device can have a lower access latency than the first memory component and can act as a cache for the first memory device. In an example, the second memory device can include a first cache component and a second cache component. The first cache component (e.g., page cache 144) can utilizes a larger granularity than the second cache component (e.g., sector cache 142). The data access operation can be a read operation or a write operation.

At operation 220, the processing logic determines whether any outstanding data transfers exist in the second memory component that correspond to the data access operation. For example, the processing logic can determine whether the first cache component and/or the second cache component include any unfinished or pending transfers associated with an address of the data access operation. The outstanding data transfers and their associated physical addresses can be stored in at least one of the sector CAM 152, the page CAM 154, or a combination thereof.

Responsive to determining that there are no outstanding data transfers associated with the address of the data access operation (e.g., a cache miss), at operation 230, the processing logic can execute the data access operation. Responsive to determining that there is an outstanding data transfer associated with the address of the data access operation (e.g., a cache hit), at operation 240, the processing logic determines whether the outstanding data transfer is being executed or is scheduled to be executed from the first memory component to the second memory component.

At operation 250, the processing logic determines to delay a scheduling of an execution of the data access operation corresponding to the cache hit when the outstanding data transfer is being executed. In an example, the processing logic can delay the data access operation until the outstanding data transfer is finished by placing the data transfer into a sector block transfer data structure at a location indexed by a CAM (e.g., sector CAM 152, page CAM 154) lookup hit ID. When a sector transfer is completed, its corresponding sector block transfer entry can be checked in the sector block transfer data structure. If the ID stored in sector block transfer data structure is not the same ID as the current transfer, the cache manager 113 can unblock the stored transfer. When a sector block transfer has a valid transfer, it can be indicated by a flag, which can be checked to see if another transfer should be unblocked.

At operation 260, responsive to the execution of the outstanding data transfer, the processing logic can schedule execution of the data access operation. In some embodiments, prior to the operation to copy data from the first memory component to the second memory component is executed, the processing logic can evict an old segment having a first granularity from the second memory device. In an example, the eviction can be based on LRU data.

Figure 3:
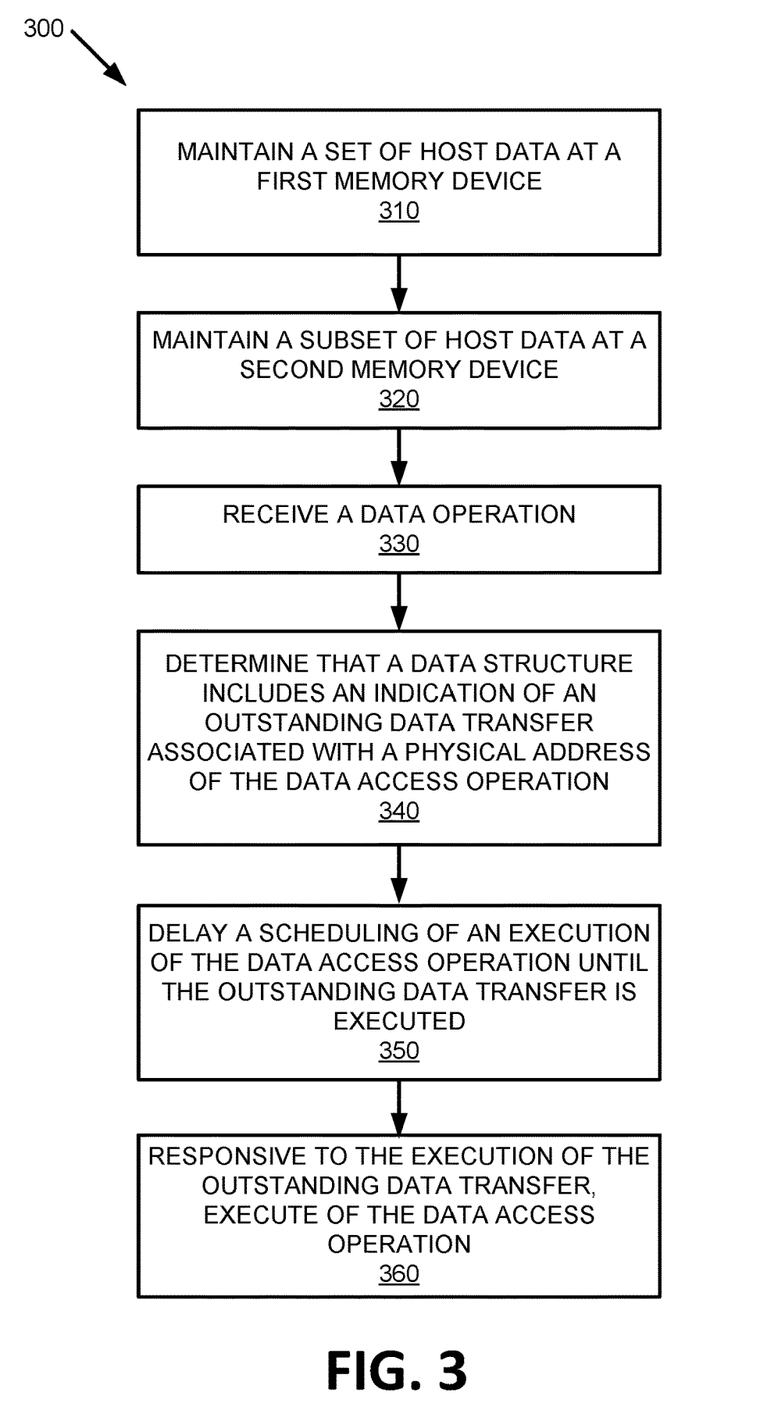
FIG. 3 is a flow diagram of another example method for managing data dependencies in a transfer pipeline, in accordance with some embodiments of the present disclosure.

FIG. 3. is a flow diagram of an example method 300 of managing data dependencies in a transfer pipeline, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the cache manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic maintains a set of host data at memory device 130. At operation 320, the processing logic maintains a subset of host data at memory device 140. The memory device 140 can have a lower access latency than the memory device 130 and is can be used as a cache for the memory device 130. The memory device 140 can maintain metadata for first segments of the subset of the host data, the first segments having a first size. In an example, the first segments include sectors.

At operation 330, the processing logic receives a data operation. The data operation can be a read access operation or a write access operation. At operation 340, the processing logic determines that a data structure includes an indication of an outstanding data transfer associated with a physical address of the data access operation. In an example, the data structure can be at least one of the sector CAM 152, the page CAM 154, or a combination thereof. In an example, the processing logic can perform a lookup of at least one of the sector CAM 152 or the page CAM 154 to determine whether a physical address being accessed by the data operation has an outstanding data transfer. For example, the data structure can have a number of entries, each corresponding to an outstanding data transfer, and each having an associated physical address. In one embodiment, cache manager 113 can compare the physical address of the data operation to the physical addresses associated with each entry in the data structure. The cache manager 113 can determine that the physical address of the data operation has an outstanding data transfer when the physical address of the data operation matches the physical address associated with at least one of the entries in the data structure.

At operation 350, responsive to determining that an operation to copy at least one first segment associated with the physical address from the first memory component to the second memory component is scheduled to be executed, the processing logic can delay a scheduling of an execution of the data access operation until the operation to copy the at least one first segment is executed. In an example, the processing logic can delay the data access operation until the outstanding data transfer is finished by placing the data transfer into a sector block transfer data structure at a location indexed by a CAM (e.g., sector CAM 152, page CAM 154) lookup hit ID. When a sector transfer is completed, its corresponding sector block transfer entry can be checked in the sector block transfer data structure. If the ID stored in sector block transfer data structure is not the same ID as the current transfer, the cache manager 113 can unblock the stored transfer. When a sector block transfer has a valid transfer, it can be indicated by a flag, which can be checked to see if another transfer should be unblocked.

At operation 360, responsive to the execution of the outstanding data transfer, the processing logic can schedule execution of the data access operation. In some embodiments, prior to the operation to copy data from the first memory component to the second memory component is executed, the processing logic can evict an old segment having a first granularity from the second memory device. In an example, the eviction can be based on LRU data.

Figure 4:
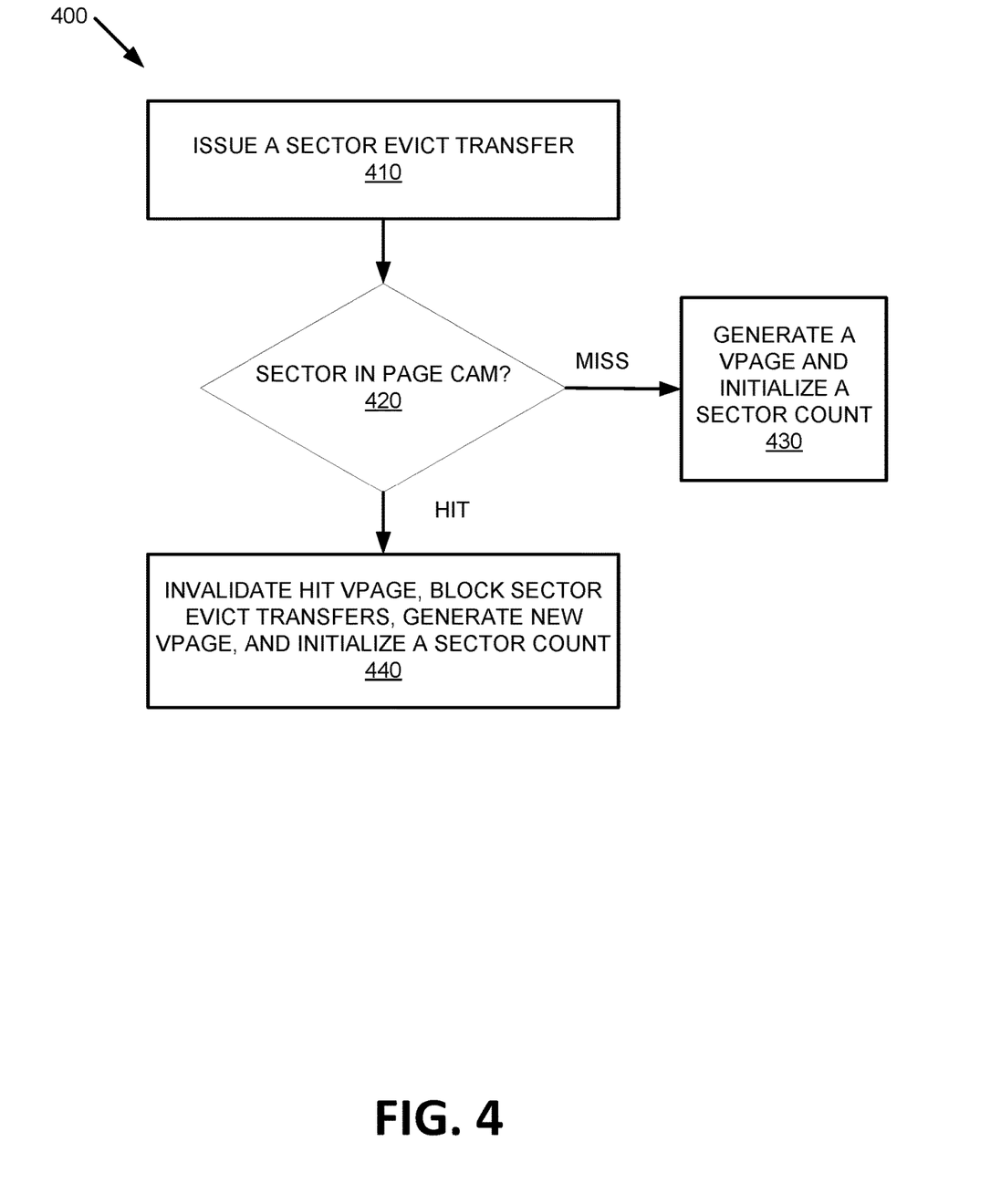
FIG. 4 is a flow diagram of an example method for performing operations related to a sector evict transfer, in accordance with some embodiments of the present disclosure.

FIG. 4. is a flow diagram of an example method 400 of performing operations related to a sector evict transfer, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the cache manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic can issue a sector evict transfer associated with a sector. At operation 420, the processing logic can perform a lookup for the sector in the page CAM 154. Responsive to a page CAM 154 lookup miss, the processing logic, at operation 430, can generate a Vpage and initialize a sector count to determine a total number of sector evict transfers. A Vpage can represent the multiple outstanding sector transfers and can use a sector count data structure to keep track of a total number of outstanding sector transfers represented by the Vpage. In an example, the sector evict transfers can use the first sector evict transfer ID as their Vpage ID.

Responsive to a page CAM 154 lookup hit, the processing logic, at operation 440, can invalidate the hit Vpage, block all sector evict transfers, generate a new Vpage, and initialize a sector count to determine a total number of sector evict transfers. In an example, the processing logic can place the first sector evict transfer ID in a page blocked next transfer data structure at a location indexed by the hit ID, and in another data structure (e.g., a page blocked list tail data structure) at the location indexed by the new Vpage. For a second sector evict transfer, the processing logic can use the first sector evict transfer ID as its Vpage ID and can also use the page blocked list tail data structure to find the location of a page blocked list to put its own transfer ID, forming a linked list with the first sector evict transfer. The page blocked list tail can also be updated with the second sector evict transfer ID. The processing logic can process the subsequent sector evict transfers like the second transfer so that all sector evict transfers form a linked list and can be unblocked one by one once the first sector evict transfer is unblocked, which can happen when the sector count of its blocking Vpage is down counted to zero.

Figure 5:
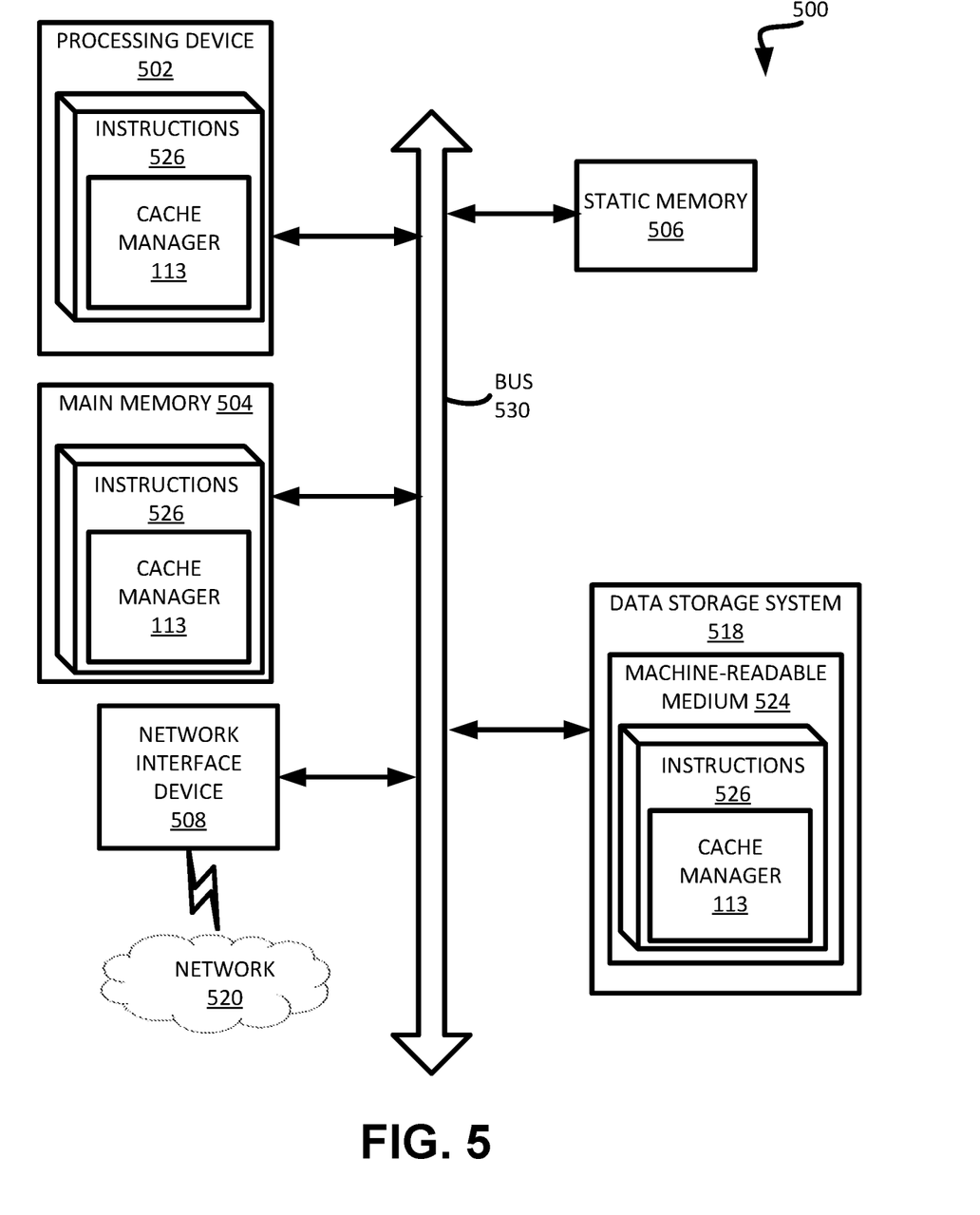
FIG. 5 is a block diagram of an example computer system in which implementations of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to cache manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530. Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to cache manager 113 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a first memory device, wherein the first memory device comprises a non-volatile memory device;
a second memory device comprising a volatile memory device coupled to the first memory device, wherein the second memory device has a lower access latency than the first memory device and is a cache for the first memory device; and
a processing device, operatively coupled to the first and second memory devices, to perform operations comprising:
receiving a current data access operation referencing a physical address associated with the first memory device;
performing a lookup in a first data structure and a second data structure to determine whether the first data structure or the second data structure includes an indication of an outstanding data access operation associated with the physical address referenced by the current data access operation, wherein the first data structure tracks outstanding data access operations at a first granularity which are stored by a first cache in the second memory device, wherein the second data structure tracks outstanding data access operations at a second granularity which are stored by a second cache in the second memory device, wherein the second granularity is larger than the first granularity;
determining that at least one of the first data structure or the second data structure includes the indication of an outstanding data access operation associated with the physical address referenced by the current data access operation;
determining whether the outstanding data access operation comprises an operation to copy data from the physical address of the first memory device to the second memory device; and
responsive to determining that the outstanding data access operation comprises an operation to copy data from the physical address of the first memory device to the second memory device, determining to delay a scheduling of an execution of the current data access operation until the outstanding data access operation is executed.

2. The system of claim 1, wherein:
the data access operation comprises at least one of a read access operation or a write access operation;
the first memory device is a cross-point array memory device; and
the data structure comprises a content-addressable memory (CAM).

3. The system of claim 1, wherein the processing device to further perform operations comprising:
responsive to determining that the data structure does not include an indication of an outstanding data transfer of data associated with a physical address of the data access operation, scheduling an execution of the data access operation.

4. The system of claim 1, wherein delaying the scheduling of the execution of the data access operation comprises storing an indication of the data access operation in a transfer data structure.

5. The system of claim 4, wherein the processing device to further perform operations comprising:
responsive to execution of the operation to copy the data from the first memory device to the second memory device, removing the indication of the outstanding data transfer from the data structure by invalidating its corresponding entry;
the data access operation from the transfer data structure; and
scheduling an execution of the data access operation.

6. The system of claim 1, wherein the second memory device is to store segments of data at a first granularity and segments of data at a second granularity, wherein the second granularity is larger than the first granularity.

7. The system of claim 6, wherein the processing device to further perform operations comprising:
evicting an old segment having a first granularity from the second memory device prior to the operation to copy data from the first memory device to the second memory device being executed.

8. A method comprising:
maintaining a set of host data at a first memory device of a memory sub-system, wherein the first memory device comprises a non-volatile memory device;
maintaining a subset of host data at a second memory device of the memory sub-system, wherein the second memory device comprises a volatile memory device having a lower access latency than the first memory device and is used as a cache for the first memory device and wherein the second memory device maintains metadata for first segments of the subset of the host data, the first segments having a first size;
receiving a current data access operation referencing a physical address associated with the first memory device;
performing a lookup in a first data structure and a second data structure to determine whether the first data structure or the second data structure includes an indication of an outstanding data access operation associated with the physical address referenced by the current data access operation, wherein the first data structure tracks outstanding data access operations at a first granularity which are stored by a first cache in the second memory device, wherein the second data structure tracks outstanding data access operations at a second granularity which are stored by a second cache in the second memory device, wherein the second granularity is larger than the first granularity
determining that at least one of the first data structure or the second data structure includes the indication of an outstanding data access operation associated with the physical address referenced by the current data access operation;
determining whether the outstanding data access operation comprises an operation to copy at least one first segment from the physical address of the first memory device to the second memory device; and
responsive to determining that the outstanding data access operation comprises an operation to copy at least one first segment from the physical address of the first memory device to the second memory device, delaying a scheduling of an execution of the data access operation until the outstanding data access operation is executed.

9. The method of claim 8, wherein:
the data access operation comprises at least one of a read access operation or a write access operation;
the first memory device is a cross-point array memory device; and
the data structure comprises a content-addressable memory (CAM).

10. The method of claim 8, further comprising:
responsive to determining that the data structure does not include an indication of an outstanding data transfer of data associated with a physical address of the data access operation, scheduling an execution of the data access operation.

11. The method of claim 8, wherein delaying the scheduling of the execution of the data access operation comprises storing an indication of the data access operation in a transfer data structure.

12. The method of claim 11, further comprising:
responsive to execution of the operation to copy at least one first segment associated with the physical address from the first memory device to the second memory device, removing the indication of the outstanding data transfer from the data structure by invalidating its corresponding entry;
retrieving the data access operation from the transfer data structure; and
scheduling an execution of the data access operation.

13. The method of claim 8, wherein the second memory device is to store segments of data at a first granularity and segments of data at a second granularity, wherein the second granularity is larger than the first granularity, and further comprising evicting an old segment having a first granularity from the second memory device prior to the operation to copy the at least one first segment from the first memory device to the second memory device being executed.

14. A non-transitory computer-readable storage medium comprising instructions that, when executed by a processing device operatively coupled to a first memory device comprising a non-volatile memory device and a second memory device comprising a volatile memory device, performs operations comprising:
receiving a current data access operation referencing a physical address associated with the first memory device;
performing a lookup in a first data structure and a second data structure to determine whether the first data structure or the second data structure includes an indication of an outstanding data access operation associated with the physical address referenced by the current data access operation, wherein the first data structure tracks outstanding data access operations at a first granularity which are stored by a first cache in the second memory device, wherein the second data structure tracks outstanding data access operations at a second granularity which are stored by a second cache in the second memory device, wherein the second granularity is larger than the first granularity;

determining that at least one of the first data structure or the second data structure includes the indication of an outstanding data access operation associated with the physical address referenced by the current data access operation;

determining whether the outstanding data access operation comprises an operation to copy data from the physical address of the first memory device to the second memory device; and responsive to determining that the outstanding data access operation comprises an operation to copy data from the physical address of the first memory device to the second memory device, determining to delay a scheduling of an execution of the data access operation until the outstanding data access operation is executed.

15. The non-transitory computer-readable storage medium of claim 14, wherein:
the data access operation comprises at least one of a read access operation or a write access operation;
the first memory device is a cross-point array memory device; and
the data structure comprises a content-addressable memory (CAM).

16. The non-transitory computer-readable storage medium of claim 14, wherein the processing device to further perform operations comprising:

responsive to determining that the data structure does not include an indication of an outstanding data transfer of data associated with a physical address of the data access operation, scheduling an execution of the data access operation.

17. The non-transitory computer-readable storage medium of claim 14, wherein delaying the scheduling of the execution of the data access operation comprises storing an indication of the data access operation in a transfer data structure.

18. The non-transitory computer-readable storage medium of claim 17, wherein the processing device to further perform operations comprising:

responsive to execution of the operation to copy the data from the first memory device to the second memory device, removing the indication of the outstanding data transfer from the data structure by invalidating its corresponding entry;

retrieving the data access operation from the transfer data structure; and scheduling an execution of the data access operation.

19. The non-transitory computer-readable storage medium of claim 14, wherein the second memory device is to store segments of data at a first granularity and segments of data at a second granularity, wherein the second granularity is larger than the first granularity.

20. The non-transitory computer-readable storage medium of claim 19, wherein the processing device to further perform operations comprising:

evicting an old segment having a first granularity from the second memory device prior to the operation to copy data from the first memory device to the second memory device being executed.

* * * * *